United States Patent [19]

Nakajima et al.

[11] Patent Number: 4,627,960

[45] Date of Patent: Dec. 9, 1986

[54] COPPER-BASED ALLOY

[75] Inventors: Takashi Nakajima; Kenji Kubosono, both of Kanagawa, Japan

[73] Assignee: Mitsubishi Denki Kabushiki Kaisha, Tokyo, Japan

[21] Appl. No.: 699,894

[22] Filed: Feb. 8, 1985

[51] Int. Cl.4 .................. C22C 0/9; H01L 23/48
[52] U.S. Cl. .................. 420/472; 420/473; 420/476
[58] Field of Search .................. 420/472, 473, 476

[56] References Cited

U.S. PATENT DOCUMENTS 4,486,250  12/1984  Nakajima .................. 420/472

FOREIGN PATENT DOCUMENTS 16044   1/1983  Japan .................. 420/472
59850   4/1984  Japan .................. 420/472
153853  9/1984  Japan .................. 420/472

Primary Examiner—Veronica O'Keefe
Attorney, Agent, or Firm—Sughrue, Mion, Zinn, Macpeak, and Seas

[57] ABSTRACT

A copper-based alloy for use in electrical and electronic devices, particularly as a material used for forming lead frames of semiconductor devices, which is less expensive than phosphor bronze while providing a mechanical strength and durability to repeated bending comparable with those of phosphor bronze, and also a relatively high conductivity. The inventive alloy is a copper-based alloy containing 1.2 to 2.5 wt % tin, 0.01 to 0.15 wt % phosphorous, 0.1 to 0.6 wt % nickel, 0.05 to 1 wt % zinc, and the remainder being copper and minute amounts of unavoidable impurities.

2 Claims, No Drawings

COPPER-BASED ALLOY

BACKGROUND OF THE INVENTION

The present invention relates to a copper-based alloy for use in electrical and electronic devices, particularly, as a material for lead frames of semiconductor devices.

Materials for lead frames of semiconductor devices should have high electrical conductivity, high mechanical strength, high durability against repeated bending, affinities for plating materials and solders, and heat durability, as well as various other properties including low thermal expansion coefficient.

Generally, FE—Ni 42 alloys, which are high in mechanical strength and low in thermal expansion coefficient, have been used for this purpose. However, the use of copper alloys for the same purposes is increasing due to the need to accommodate semiconductor devices of increased power while providing a reduced cost.

Ideal properties of a material of semiconductor lead frames includes a tensile strength of 50 kg/mm$^2$ or more, elongation of 10% or more, and electrical conductivity of 50% IACS or more. However, there is no known material which can simultaneously satisfy all of these requirements. Usually phosphor bronze is selected when the mechanical strength and bending durability are predominant requirements and copper-based alloy coated materials when conductivity and cost are predominant. However, conventional phosphor bronze exhibits a low conductivity and is high in cost because the cost of Sn is high. Copper alloys, on the other hand, are generally low in mechanical strength and durability for repeated bendings.

SUMMARY OF THE INVENTION

An object of the present invention is to provide a material for use in electronic devices, particularly, for lead frames for semiconductor devices, which is inexpensive compared with phosphor bronze, while exhibiting a mechanical strength and repeated bending durability comparable with those of phosphor bronze, and which has a relatively high conductivity.

The present invention resides in a copper-based alloy which contains 1.2 to 2.5 wt% tin (Sn), 0.01 to 0.15 wt% phosphorous (P), 0.1 to 0.6 wt% nickel (Ni), and 0.05 to 1 wt% zinc (Zn), the remainder being copper and minute amounts of unavoidable impurities.

DESCRIPTION OF THE PREFERRED EMBODIMENTS

Preferred embodiments of the present invention will now be described.

As stated above, the present invention resides in a copper-based alloy which contains 1.2 to 2.5 wt% tin (Sn), 0.01 to 0.15 wt% phosphorous (P), 0.1 to 0.6 wt% nickel (Ni), and 0.05 to 1 wt% zinc (Zn), the remainder being copper and minute amounts of unavoidable impurities.

Above the lower limit of tin of 1.2 wt%, a tensile strength of 50 kg/mm$^2$ or more and an elongation of 10% or more are obtainable (with the possible aid of an addition of nickel), and the upper limit of 2.5 wt% is determined in view of cost and the conductivity of the alloy.

The range of nickel is chosen for economic reasons as well as for the reason that the crystal grain size of Cu—Sn alloy is minimized without substantially affecting the conductivity.

The amount of phosphorous at which the deoxidation effect is obtained is selected as the lower limit, and the upper limit thereof is selected in view of conductivity.

Zinc is added as a deoxidation agent for deoxidizing the alloy sufficiently to provide intimate contact with a plating metal layer when used as a lead frame and for improving the plastic deformability of the alloy. The range of zinc is determined so that these effects are obtainable.

The desired deoxidation effect can be substantially provided by the addition of phosphorous. Since, however, the electrical conductivity of the alloy is substantially influenced by the amount of phosphorous, it is desired to minimize the phosphorous content.

The range of zinc is chosen so as to not substantially affect the conductivity but to be effective in compensating for the deoxidation effect produced by phosphorous.

Table 1 shows samples prepared for experimental use:

TABLE 1

| Sample No. | Sn | Ni | P | Zn | Cu | Note |
|---|---|---|---|---|---|---|
| 1 | 2.03 | 0.19 | 0.07 | 0.01 or less | Bal | comparative sample |
| 2 | 2.01 | 0.20 | 0.07 | 0.13 | " | inventive sample |
| 3 | 2.03 | 0.18 | 0.09 | 0.31 | " | inventive sample |
| 4 | 2.04 | 0.01 or less | 0.07 | 0.11 | " | comparative sample |
| 5 | 2.01 | 0.11 | 0.08 | 0.14 | " | inventive sample |
| 6 | 2.02 | 0.42 | 0.08 | 0.14 | " | inventive sample |
| 7 | 1.21 | 0.01 or less | 0.08 | 0.12 | " | comparative sample |
| 8 | 1.20 | 0.22 | 0.09 | 0.13 | " | inventive sample |

Each sample was obtained from a plate 0.25 mm thick prepared by melting in a high frequency inductor furnace to obtain an ingot and repeatingly cold-rolling and annealing the ingot, with the final rolling rate being 37%.

Table 2 shows the mechanical properties, conductivity (IACS%), and the crystal grain size (microns) of the samples:

TABLE 2

| Sample No. | Tensile Strength (Kg/mm$^2$) | Elongation (%) | Hardness (HV (0.5)) | Number of Bendings | Conductivity (IACS %) | Grain Size Microns |
|---|---|---|---|---|---|---|
| 1 | 55.4 | 11.6 | 168 | 6.2 | 29.8 | 5 |
| 2 | 55.6 | 11.4 | 170 | 6.4 | 30.0 | 5 |
| 3 | 55.2 | 11.2 | 166 | 6.0 | 29.9 | 5 |
| 4 | 50.8 | 12.0 | 160 | 5.8 | 30.2 | 20 |
| 5 | 53.8 | 11.8 | 165 | 6.2 | 30.1 | 5–10 |
| 6 | 55.8 | 12.0 | 173 | 6.0 | 29.9 | 5 |
| 7 | 44.2 | 7.0 | 145 | 4.2 | 44.2 | 20–25 |

TABLE 2-continued

| Sample No. | Tensile Strength (Kg/mm$^2$) | Elongation (%) | Hardness (HV (0.5)) | Number of Bendings | Conductivity (IACS %) | Grain Size Microns |
|---|---|---|---|---|---|---|
| 8 | 49.2 | 7.2 | 155 | 4.6 | 44.0 | 5 |

The bending test was performed by bending a sample plate having a cross-sectional area of 0.125 mm$^2$ by 90° in one direction with a load of 250 g and returning it to its original state. The numbers of the bendings before breakage are tabulated in Table 2.

As is clear from Table 2, the alloy according to the present invention is superior in mechanical properties and bending durability, and there is no undesirable effect of the additions of nickel and zinc on its electrical conductivity. That is, samples nos. 2, 4, 5, 6, 7 and 8, whose nickel contents are different, show improved tensile strength, hardness and bending characteristics without degradation of elongation and conductivity. The crystal grain size of each of the samples 1, 2, 3, 6 and 8 is minimized by the addition of nickel, which contributes to the improvement of the mechanical characteristics. The amount of improvement tends to saturate at or above 0.2 wt% Ni.

The mechanical characteristics, conductivity and crystal grain size of each of the samples nos. 1 to 3 were not degraded by the addition of zinc. Therefore, zinc is effective as the deoxidation agent without degradation to other desired properties.

The durability of solder on the lead frame with respect to atmospheric conditions is important. In order to evaluate the degradation of such characteristics which may be caused by Ni and/or Zn, each sample was immersed in a solder bath containing pure Sn and Pb—Sn in a ratio of 9:1 and then exposed to air at 150° C. for 500 hours. Thereafter, each sample was bent through an angle of 180° and evaluated as to whether peeling of the solder from the sample occurred. No peeling of the solder was observed for any sample of the invention.

Lead frames were made from samples nos. 1 to 3, and die-receiving portions thereof were partially plated with Ag. Then the lead frames were heated at 450° C. for 5 minutes and the amount of bubbling of the Ag platings on the lead frames were observed. The amounts of bubbling of the Ag layers on the lead frames made from samples nos. 2 and 3 were very small compared with that of the Ag layer on the lead frame made from sample no. 1.

As mentioned hereinbefore, the alloy according to the present invention, which contains only relatively inexpensive metal components, exhibits a mechanical strength comparable with that of phosphor bronze and a relatively high conductivity with a minimized variations. With the alloy of the present invention, good stability of solder and minimized bubbling of the plating thereon are achieved, making the inventive alloy superior for use in lead frames for semiconductor devices.

It should be noted that although the alloy of the present invention, which is high in mechanical strength and conductivity, has been described as a material useful for lead frames, the alloy may be used as well as a material for other electrical and electronic devices.

Further, by removing stress from the alloy, it is made usable as a spring material. Low temperature (150° to 450° C.) annealing or tension annealing may be used for this purpose.

We claim:

1. A copper-based alloy consisting essentially of 1.2 to 2.5 wt% tin, 0.07 to 0.15 wt% phosphorous, 0.01 to 0.6 wt% nickel, 0.05 to 1 wt% zinc, and the remainder being copper and minute amounts of unavoidable impurities, said alloy being substantially free of manganese.

2. A lead frame for a semiconductor device made of a copper-based alloy consisting essentially of 1.2 to 2.5 wt% tin, 0.07 to 0.15 wt% phosphorous, 0.1 to 0.6 wt% nickel, 0.05 to 1 wt% zinc, and the remainder being copper and minute amounts of unavoidable impurities, said alloy being substantially free of manganese.

* * * * *